United States Patent
Kim et al.

(10) Patent No.: US 12,026,338 B2
(45) Date of Patent: Jul. 2, 2024

(54) TOUCH DISPLAY DEVICE, METHOD OF DRIVING THE SAME, AND TIMING CONTROLLER

(71) Applicant: LX SEMICON CO., LTD., Daejeon (KR)

(72) Inventors: Young Gi Kim, Daejeon (KR); Hae Won Lee, Daejeon (KR); Woong Jin Oh, Daejeon (KR); Jae Woo Jeon, Daejeon (KR)

(73) Assignee: LX SEMICON CO., LTD., Daejeon (KR)

( * ) Notice: Subject to any disclaimer, the term of this patent is extended or adjusted under 35 U.S.C. 154(b) by 267 days.

(21) Appl. No.: 17/551,883

(22) Filed: Dec. 15, 2021

(65) Prior Publication Data
US 2022/0197467 A1 Jun. 23, 2022

(30) Foreign Application Priority Data
Dec. 21, 2020 (KR) .......................... 10-2020-0179861

(51) Int. Cl.
*G06F 3/041* (2006.01)
*G06F 3/044* (2006.01)

(52) U.S. Cl.
CPC ...... *G06F 3/04166* (2019.05); *G06F 3/04164* (2019.05); *G06F 3/0443* (2019.05)

(58) Field of Classification Search
None
See application file for complete search history.

(56) References Cited

U.S. PATENT DOCUMENTS

| | | | |
|---|---|---|---|
| 2014/0240246 A1* | 8/2014 | Kim .......................... | G09G 5/18 345/173 |
| 2015/0091826 A1* | 4/2015 | Oh ........................ | G09G 3/2096 345/173 |
| 2019/0129564 A1* | 5/2019 | Kim ..................... | G06F 3/04166 |

FOREIGN PATENT DOCUMENTS

| | | |
|---|---|---|
| KR | 10-2017-0070878 A | 6/2017 |
| KR | 10-2020-0011985 A | 2/2020 |
| KR | 10-2089332 B1 | 3/2020 |
| KR | 10-2226166 B1 | 3/2021 |

* cited by examiner

*Primary Examiner* — Krishna P Neupane
(74) *Attorney, Agent, or Firm* — ROTHWELL, FIGG, ERNST & MANBECK, P.C.

(57) ABSTRACT

Disclosed herein are a touch display device capable of solving distortion of a display image due to a difference in condition between touch nodes, and a method of driving the same. The touch display device includes a panel driver configured to drive gate lines and data lines of a panel and drive and sense touch electrodes, a timing controller configured to control an operation of the panel driver, and a touch controller configured to control touch electrode driving and a sensing operation of the panel driver, wherein the timing controller compensates a display signal for a difference in condition between a touch node where a touch occurs and a touch node where a touch does not occur or a difference in physical structure between the touch nodes.

17 Claims, 7 Drawing Sheets

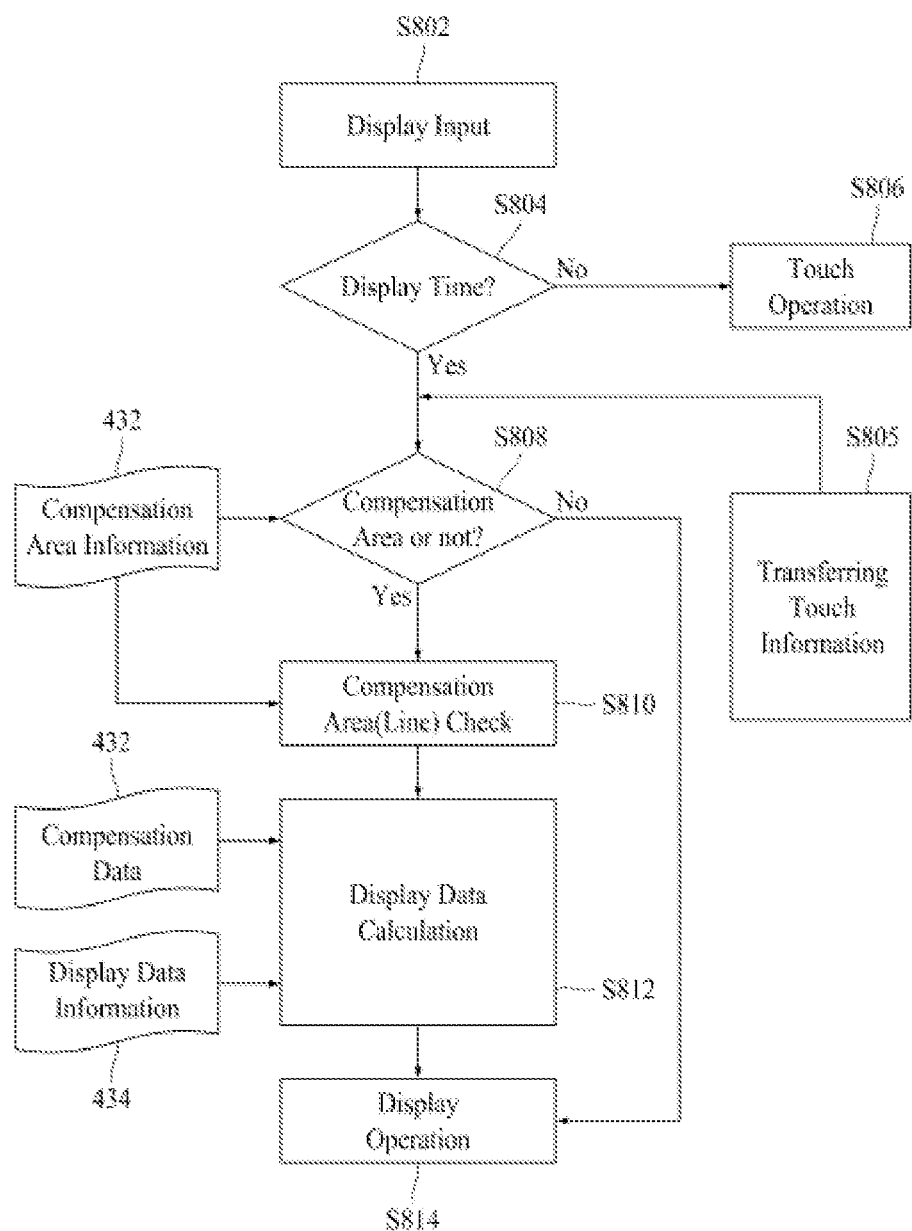

TOUCH DISPLAY DEVICE, METHOD OF DRIVING THE SAME, AND TIMING CONTROLLER

CROSS-REFERENCE TO RELATED APPLICATIONS

This application claims the benefit of the Korean Patent Application No. 10-2020-0179861 filed on Dec. 21, 2020, which is hereby incorporated by reference as if fully set forth herein.

FIELD OF THE INVENTION

The present disclosure relates to a touch display device capable of reducing distortion of a display image due to a difference in condition between touch nodes, a method of driving the same, and a timing controller.

BACKGROUND

Touch sensors capable of inputting information using a touch on a screen of a display are being widely applied to various displays, such as laptop computers, monitors, and home appliances, as well as portable information devices such as smart phones.

Touch sensors applied to a display include an add-on type touch sensor in which a touch panel is attached on a display panel and in-cell type touch sensors in which a touch electrode is embedded in the display panel. As the in-cell type touch sensor, an advanced in-cell touch (AIT) type touch sensor in which a common electrode of a liquid crystal display is divided and used as a touch electrode is known.

Since an AIT display device provides both of an image display function and a touch sensing function through a panel, the AIT display device operates to divide each frame period divided into a display operation period and a touch operation period.

However, in the AIT touch display device, according to a configuration and an alternating operation of the touch node or after a touch operation, a difference in condition such as a potential difference occurs between a touch node where a touch occurs and a touch node where a touch does not occur so that there is a problem in that degradation of image quality, in which a displayed image displayed during a display operation is distorted, occurs.

SUMMARY

Accordingly, according to the present disclosure, there are provided a touch display device capable of reducing distortion of a display image due to a difference in condition between touch nodes, a method of driving the same, and a timing controller.

According to an aspect of the present disclosure, there is provided a touch display device including a panel driver configured to drive gate lines and data lines of a panel and drive and sense touch electrodes, a timing controller configured to control an operation of the panel driver, and a touch controller configured to control touch electrode driving and a sensing operation of the panel driver.

The timing controller may compensate a display signal for a difference in condition between a touch node where a touch occurs and a touch node where a touch does not occur or a difference in physical structure between the touch nodes.

The timing controller may compensate at least one of a data signal and a gate signal, which are supplied to subpixels of a touch occurrence area in which a touch node where the touch occurs is located or supplied to subpixels of a touch node set as a compensation area according to the difference in physical structure between the touch nodes in the panel, by applying a preset compensation value.

The timing controller may additionally compensate at least one of a data signal and a gate signal, which are supplied to subpixels in which touch electrodes having different sizes are located among the touch electrodes, by applying a preset compensation value.

Subpixels overlapping each touch node may be divided into a plurality of compensation areas according to a distance from an adjacent touch node. The timing controller may compensate data to be supplied to the subpixels of the touch occurrence area or subpixels of the compensation area by applying a different compensation value or the same compensation value according to the plurality of compensation areas to each subpixel.

The timing controller may compensate a pulse width of a gate signal to be supplied to the subpixels of the compensation area by applying a different compensation value or the same compensation value to each subpixel.

The timing controller may receive position information of each touch node where the touch occurs from the touch controller and determine whether the corresponding subpixel is included in the touch occurrence area or the touch non-occurrence area or receive physical structure information and position information of each touch node from the touch controller and determine whether the corresponding subpixel is included in the touch occurrence area or the touch non-occurrence area.

The timing controller may generate a touch synchronization signal for time-divisionally driving each frame period as each display operation period and each touch operation period, control the panel driver to direct the panel to perform a display operation during each display operation period on the basis of the touch synchronization signal, and share the touch synchronization signal with the touch controller and control the panel driver to direct the panel to perform a touch operation during each touch operation period.

The timing controller may include a memory configured to store input data, a compensation information register configured to store position information and a compensation value of the compensation area, and a display data calculator configured to apply the compensation value according to the position information of the compensation area provided from the compensation information register to the data output from the memory in the case of the subpixel included in the touch occurrence area during each display operation period, output compensated data, and output the data from the memory without compensation in the case of the subpixel included in the touch non-occurrence area.

During each display operation period, in the case of the subpixel of the compensation area stored in the compensation information register due to a difference in size between the touch electrode, the display data calculator may apply the compensation value from the compensation information register to the data output from the memory and output the compensated data.

The timing controller may include a gate control signal calculator configured to generate an adjustment signal for adjusting a pulse width of a corresponding gate signal according to the position information and the compensation value of the compensation region provided from the compensation information register in the case of the subpixel included in the touch occurrence region or the subpixel of the compensation region stored in the compensation information register during each display operation period, and a gate control signal generator configured to generate and output, using synchronization signals and the adjustment signal, gate control signals for controlling a gate driver of the panel drivers during each display operation period.

According to another aspect of the present disclosure, there is provided a method of driving a touch display device, which includes time-dividing each frame period into each display operation period and each touch operation period using a touch synchronization signal, generating information on a touch occurrence area, which includes position information of each touch node where a touch occurs during each touch operation period, and compensating a display signal supplied to subpixels of the touch occurrence area in which the touch node where the touch occurs is located or supplied to subpixels of the touch node set as the compensation area according to a difference in physical structure of each touch node during each display operation period.

The compensating of the display signal may compensate at least one of a data signal and a gate signal supplied to the subpixels of the touch occurrence area or the compensation area by applying a preset compensation value.

The method of driving a touch display device may further include, during each display operation period, compensating at least one of a data signal and a gate signal, which are supplied to subpixels in which touch electrodes having different sizes are located among the touch electrodes, by applying a preset compensation value.

BRIEF DESCRIPTION OF THE DRAWINGS

The accompanying drawings, which are included to provide further understanding of the disclosure and are incorporated in and constitute a part of this application, illustrate embodiments of the disclosure and together with the description serve to explain the principle of the disclosure. In the drawings:

FIG. 9 is a flowchart illustrating a method of driving a touch display device according to one embodiment.

DETAILED DESCRIPTION OF THE DISCLOSURE

Figure 1:
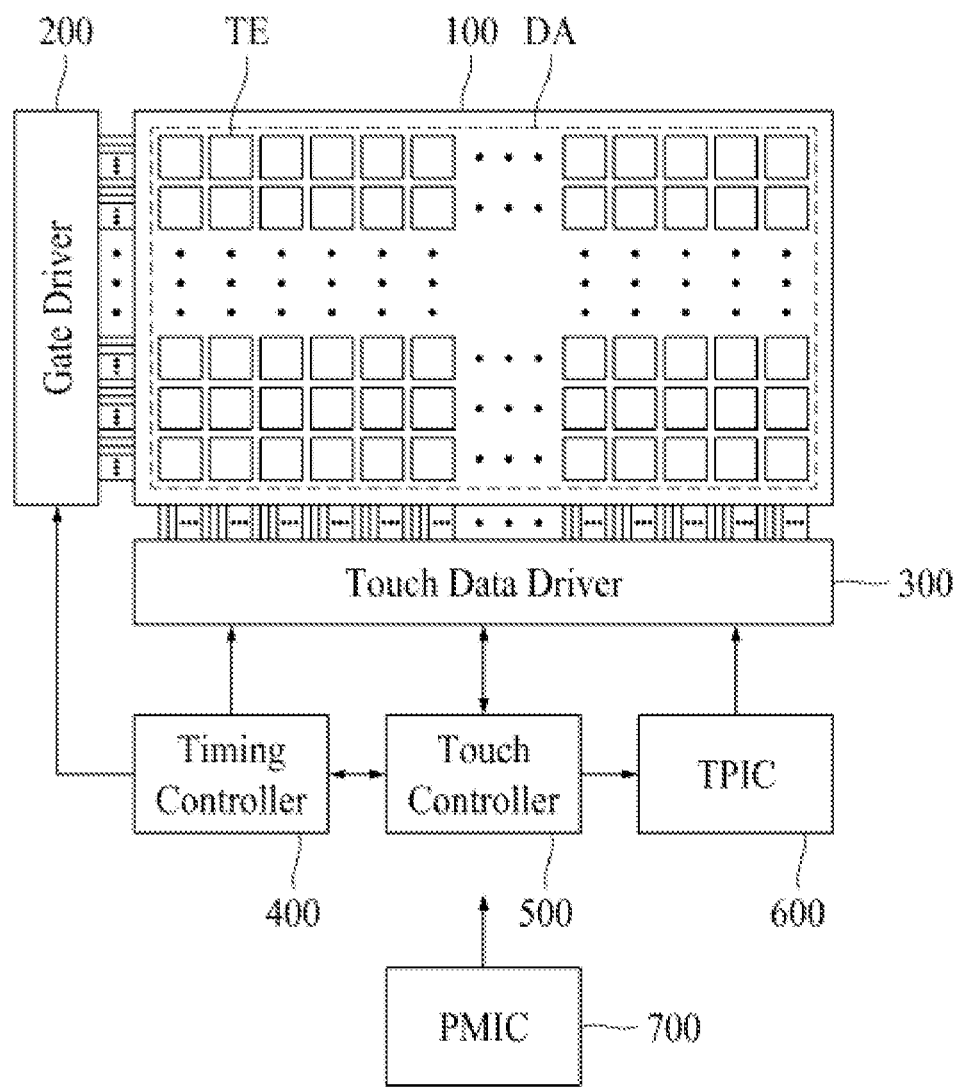
FIG. 1 is a block diagram illustrating a configuration of a touch display device according to one embodiment.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless conly-' is used. The terms of a singular form may include plural forms unless referred to the contrary.

In construing an element, the element is construed as including an error range although there is no explicit description.

In describing a position relationship, for example, when a position relation between two parts is described as "on," "over," "under," and "next," one or more other parts may be disposed between the two parts unless a more limiting term, such as "just" or "direct(ly)" is used.

In describing a time relationship, for example, when the temporal order is described as, for example, "after," "subsequent," "next," and "before," a case which is not continuous may be included unless a more limiting term, such as "just," "immediate(ly)," or "direct(ly)" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, the terms "first," "second," "A," "B," "(a)," "(b)," etc., may be used. These terms are intended to identify the corresponding elements from the other elements, and basis, order, or number of the corresponding elements should not be limited by these terms. The expression that an element or layer is "connected," "coupled," or "adhered" to another element or layer, the element or layer can not only be directly connected or adhered to another element or layer, but also be indirectly connected or adhered to another element or layer with one or more intervening elements or layers "disposed" between the elements or layers, unless otherwise specified.

The term "at least one" should be understood as including any and all combinations of one or more among the associated listed elements. For example, the meaning of "at least one or more of a first element, a second element, and a third element" denotes the combination of all elements proposed from two or more of the first element, the second element, and the third element as well as the first element, the second element, or the third element.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

As used herein, the term "part" refers to software or a hardware component such as a field-programmable gate array (FPGA) or an application-specific integrated circuit (ASIC), and the "part" performs certain functions. However, the "part" is not limited to software or hardware. The "part" may be configured to be stored in a storage medium that may be addressed or may be configured to be executed by one or more processors. Therefore, the "part" includes, for example, software components, processes, functions, drivers, firmware, circuits, data, database, and tables.

Hereinafter, exemplary embodiments of the present disclosure will be described in detail with reference to the accompanying drawings.

Figure 2:
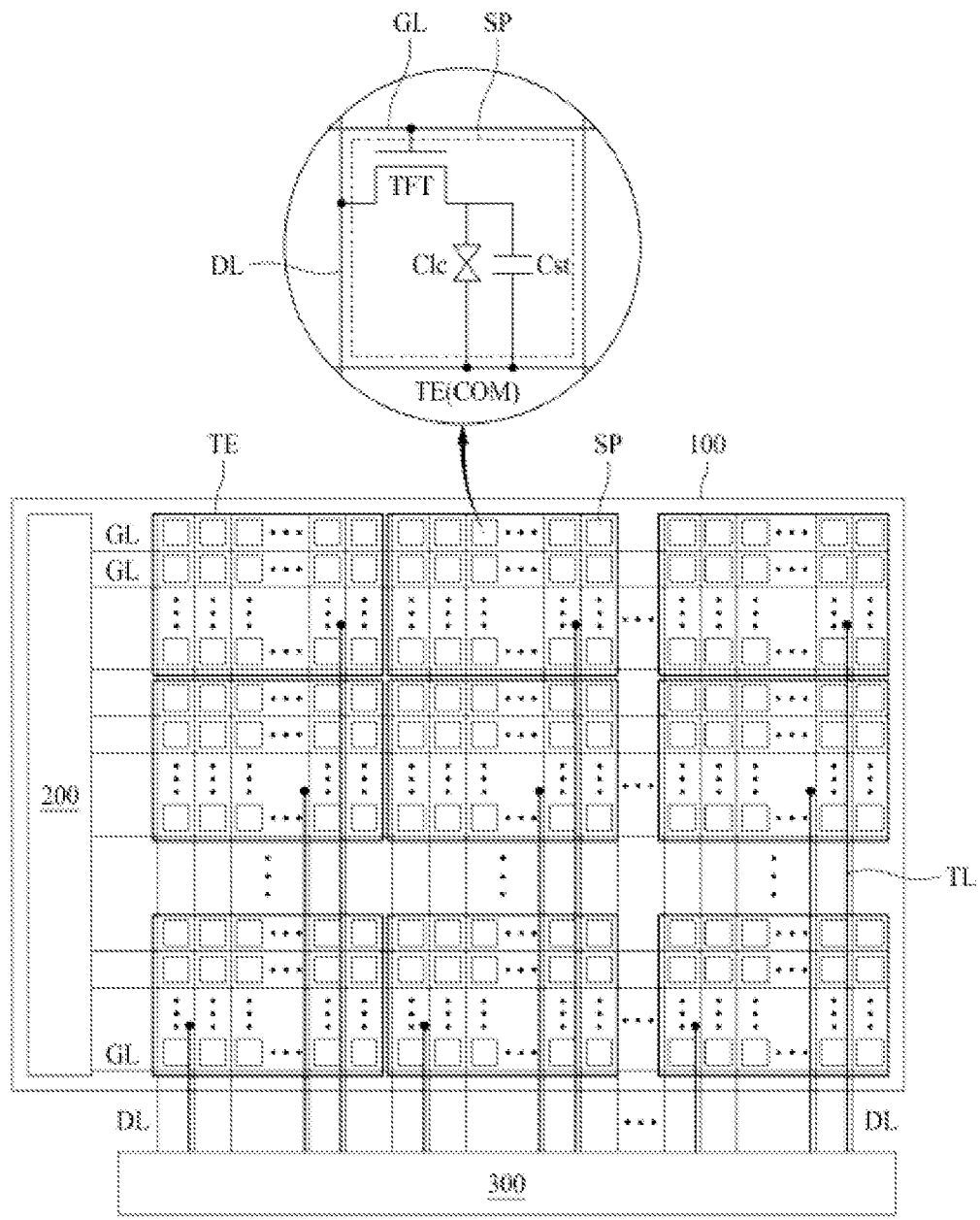
FIG. 2 is a diagram illustrating configurations of a touch electrode and a subpixel in a panel according to one embodiment.
Figure 3:
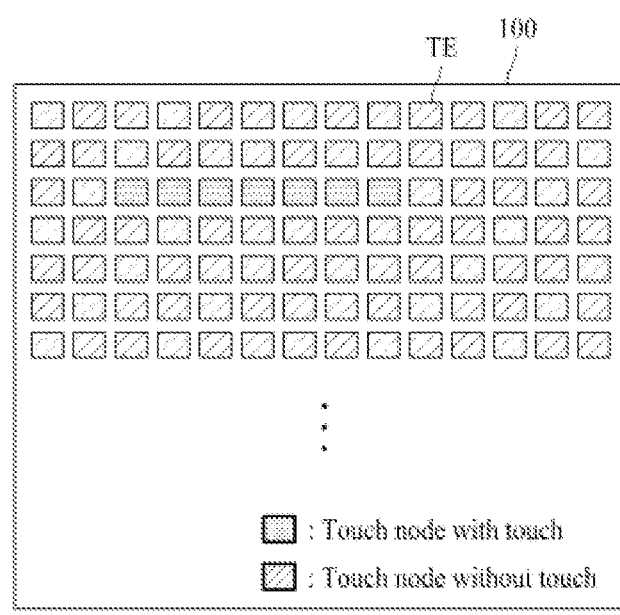
FIG. 3 is a diagram for describing an effect according to a structural configuration of a touch node and a difference in condition between touch nodes due to occurrence of a touch in the touch display panel according to one embodiment.

FIG. 1 is a schematic block diagram illustrating a configuration of a touch display device according to one embodiment, FIG. 2 is a diagram illustrating configurations of a touch electrode and a subpixel in a panel according to one embodiment, and FIG. 3 is a diagram for describing an effect according to a structural configuration of a touch node and a difference in condition between touch nodes due to occurrence of a touch in the touch display panel according to one embodiment.

Referring to FIG. 1, the touch display device includes a panel 100, a gate driver 200, a touch data driver 300, a timing controller 400, a touch controller 500, a touch power integrated circuit (TPIC) 600, and a power management integrated circuit (PMIC) 700. The gate driver 200 and the touch data driver 300 may be defined as panel drivers. The PMIC 700 and the TP IC 600 may be defined as power circuits.

The panel 100 has a touch sensing function and a display function. The panel 100 displays an image through a display area DA in which subpixels are disposed in the form of a matrix. By using touch electrodes TE, which are used as a common electrode, included in a pixel matrix of the display area DA, the panel 100 may output a signal indicating whether a touch occurs through a capacitance variation.

Each subpixel SP is any one among a red subpixel for emitting red light, a green subpixel for emitting green light, a blue subpixel for emitting blue light, and a white subpixel for emitting white light and is independently driven by at least one thin film transistor (TFT). A unit pixel may be formed as a combination of two, three, or four subpixels having different colors.

A gate electrode of the TFT included in each subpixel SP is connected to the gate driver 200 through a gate line GL disposed in the panel 100, and one input electrode of any one of a source electrode and a drain electrode of each TFT is connected to the touch data driver 300 through a data line DL disposed in the panel 100.

For example, as shown in FIG. 2, each subpixel SP includes the TFT connected to the gate line GL and a data line DL, and a liquid crystal capacitor Clc and a storage capacitor Cst which are connected to the TFT and the touch electrode TE which is a common electrode COM. The liquid crystal capacitor Clc is charged with a difference voltage between a voltage of a data signal supplied to a pixel electrode through the TFT and a common voltage supplied to the touch electrode TE and drives a liquid crystal according to the charged voltage to control light transmittance. The storage capacitor Cst stably maintains the voltage charged in the liquid crystal capacitor Clc.

The panel 100 includes a touch electrode matrix formed of touch electrodes TE, which each have a common electrode function of a pixel matrix and a touch sensor function.

Either a mutual capacitance touch sensing method or a self-capacitance touch sensing method may be applied as a capacitance touch sensing method applied to the panel 100.

In the mutual capacitance touch sensing method, the touch electrodes TE may be disposed to be divided into driving electrodes and sensing electrodes. The driving electrode of the touch electrodes TE may receive a touch synchronization signal from the touch data driver 300, and the sensing electrode of the touch electrodes TE may provide a readout signal indicating a variation in mutual capacitance between the driving electrode and the sensing electrode, which is generated due to a touch, to the touch data driver 300.

In the self-capacitance touch sensing method, each touch electrode TE may receive a touch synchronization signal from the touch data driver 300 and may provide a readout signal indicating a variation in self-capacitance generated due to a touch to the touch data driver 300.

Hereinafter, in the embodiment of the present disclosure, an example of the self-capacitance touch sensing method will be described.

For example, as shown in FIG. 2, the touch electrode matrix includes a plurality of touch electrode columns, and each touch electrode column includes a plurality of touch electrodes TE disposed in a direction of the data line DL and a plurality of touch routing lines TL which connect each of the plurality of touch electrodes TE to the touch data driver 300. The plurality of touch electrodes TE are formed such that the common electrode COM located in the pixel matrix is divided into a plurality of segments, and each touch electrode TE is formed at a predetermined size including a plurality of subpixels SP in consideration of a size of a touch point. Each touch electrode TE is connected in common to a plurality of subpixels SP overlapping each touch electrode TE and forms one touch sensor.

The PMIC 700 receives an input voltage and generates and supplies a plurality of driving voltages required in the touch display device. By using the input voltage, the PMIC 700 may generate and supply a plurality of driving voltages required in the TP IC 600, the timing controller 400, the touch controller 500, the gate driver 200, and the touch data driver 300. For example, the PM IC 700 may generate and supply a digital circuit driving voltage to each driving circuit and may generate and supply an analog circuit driving voltage to the TP IC 600 and the touch data driver 300. The PM IC 700 may generate and supply driving voltages required in the gate driver 200. The PM IC 700 may generate and supply a common voltage VCOM to the TP IC 600.

The TP IC 600 may receive the output voltage of the PM IC 700 and a control signal of the touch controller 500 and may generate and output a plurality of driving signals required in driving circuits related to touch driving and sensing, such as the gate driver 200 and touch data driver 300.

Under the control of the touch controller 500, the TP IC 600 may supply the common voltage VCOM, which is supplied from the PMIC 700 during the display operation period, to the touch data driver 300. During the touch operation period TP, the TPIC 600 may generate a touch synchronization signal of an alternating-current (AC) waveform in the form of a pulse according to a pulse width modulation (PWM) signal supplied from the touch controller 500 and supply the touch synchronization signal to the touch data driver 300. Meanwhile, during the touch operation period TP, the TPIC 600 may generate a gate-off modulation signal having the same phase and the same amplitude as the touch synchronization signal according to the PWM signal and further supply the gate-off modulation signal to the gate driver 200.

The timing controller 400 may receive image data and synchronization signals from a host system (not shown). For example, the host system may be any one among a computer, a television (TV) system, a set-top box, and a system of a portable terminal such as a tablet or a mobile phone. The synchronization signal may include a dot clock, a data enable signal, a vertical synchronization signal, and a horizontal synchronization signal.

By using timing signals supplied from the host system and timing information stored in a register, the timing controller 400 may generate a touch synchronization signal for time-division driving each frame in at least one display operation period and at least one touch operation period and may supply the generated touch synchronization signal to the touch controller 500 and the touch data driver 300. The touch synchronization signal may control each display operation period and each touch operation period to alternate.

Each display operation period DP (see FIG. 4), which is distinguished by the touch synchronization signal, refers to a period in which image data is charged (written) in sub-pixels of a pixel block in the panel 100 through the panel drivers 200 and 300. Each touch operation period TP (see FIG. 4) refers to a period in which the touch synchronization signal is applied to the touch electrodes TE in the panel 100 and a capacitance variation is read out from a corresponding touch electrode TE.

By using the supplied synchronization signals, the supplied touch synchronization signal, and timing setting information (including a start timing, a pulse width, and the like) stored in the register, the timing controller 400 may generate data control signals for controlling an operation timing of the touch data driver 300 and supply the data control signals to the touch data driver 300. For example, the data control signals may include a source start pulse used to control a latch timing of data, a source sampling clock, a source output enable signal for controlling an output timing of data, and a polarity control signal for controlling a polarity of the data signal.

By using the supplied synchronization signals, the supplied touch synchronization signal, and the timing setting information stored in the register, the timing controller 400 may generate gate control signals for controlling an operation timing of the gate driver 200 and supply the gate control signals to the gate driver 200. For example, the gate control signals may include a gate start pulse used in a shift register operation of the gate driver 200, a gate shift clock, and a gate output enable signal for controlling an output timing of a gate pulse.

The timing controller 400 may store image data, which is supplied from the system, in a memory. The timing controller 400 may perform various processes for image quality compensation and power consumption reduction on the image data and store the processed image data. During each display operation period DP, the timing controller 400 may read image data of a corresponding pixel block from the memory at a read speed that is faster than a write speed and supply the image data and the data control signals to the touch data driver 300.

In particular, the timing controller 400 may compensate for a difference of a display signal generated, during the display operation period DP, between a touch occurrence area and a touch non-occurrence area due to a potential difference between a touch node where a touch occurs and a touch node where a touch does not occur in the panel 100, that is, distortion of a display signal, which may occur in a touch occurrence area due to a variation in potential of a corresponding touch node when a touch occurs.

For example, the touch electrodes TE of the panel 100 shown in FIG. 3 may be distinguished into touch nodes where a touch occurs and touch nodes where a touch does not occur after a touch operation. In the touch electrodes TE used as a common electrode during the display operation period DP, a potential difference may occur between touch nodes where a touch occurs and touch nodes where a touch does not occur. Accordingly, when compared to a touch non-occurrence area, in the touch occurrence area, since a parasitic capacitance between a touch electrode TE and the data line DL or between the touch electrode TE and gate line GL is varied due to a variation in potential of the touch electrode TE, a display signal such as the data signal or the gate signal is distorted so that a display image may be distorted. In addition, in the panel 100, the touch nodes may each have a physical structure difference, for example, a physical difference such as a difference in overlapping area or distance with a display electrode (a gate line, a data line, a pixel electrode, or the like) overlapping the touch electrode TE. Due to the physical structure difference between the touch nodes in the panel 100 and an alternating operation of the display operation and the touch operation of the panel 100, the display signal such as the data signal or the gate signal is distorted so that a display image may be distorted.

In order to reduce the above problems, when a touch occurs, the timing controller 400 may compensate a variation of the display signal (the data signal or the gate signal) for a difference in condition between the touch nodes by adjusting the image data or the gate control signal. Compensation information for adjusting the image data or the gate control signal may be preset and stored in the register.

The timing controller 400 may share touch coordinate information for the touch nodes in which a touch occurs, that is, position information on the touch occurrence area, through communication with the touch controller 500. The timing controller 400 may share a result of determining whether each sub-pixel is located in the touch occurrence area or the touch non-occurrence area through communication with the touch controller 500. Meanwhile, information on the physical structures of the touch nodes in the panel 100 or information on a difference between the physical structures is preset and stored in the timing controller 400. The timing controller 400 and the touch controller 500 may share the information on the physical structures of the touch nodes or information on the difference between the physical structures.

During the display operation period DP, the timing controller 400 may compensate image data to be charged in a subpixel of the touch occurrence area by applying the compensation data stored in the register and may output the compensated data to the touch data driver 300. The timing controller 400 may compensate the image data for each subpixel for a position of the subpixel even in the touch occurrence area by applying a compensation data set according to a distance to an adjacent touch node.

Even when a difference in condition between the touch nodes occurs due to a difference in size between the touch electrodes TE, the timing controller 400 compensates the image data to be supplied to a corresponding subpixel using the compensation information (a compensation position and compensation data) stored in the register so that distortion of the displayed image may be prevented.

Meanwhile, the timing controller 400 may compensate the variation of the gate signal for the difference in condition between the touch nodes by adjusting the gate control signal. In the case of the touch occurrence area or an area in which the touch electrodes TE have different sizes, the timing controller 400 may adjust a pulse width of the gate signal to be supplied to the corresponding sub-pixel by correcting a corresponding gate control signal (a gate output enable signal).

In the case of the touch non-occurrence area or when the touch occurrence area is changed to the touch non-occurrence area during the touch operation period TP, the timing controller 400 may output the image data or the gate control signal without compensation through communication with the touch controller 500.

Compensation data, in consideration of a degree of a variation of the data signal or the gate signal due to the variation in potential of the touch electrode TE when a touch occurs, may be preset and stored in the register of the timing controller 400. Alternatively, compensation data for the difference in physical structure between the touch nodes may be preset and stored in the register of the timing controller 400. In each touch node, the compensation data may be set to be different or identical for a position of each subpixel.

Alternatively, compensation data in consideration of the degree of the variation of the data signal or the gate signal for a difference in potential between the touch electrodes TE when the sizes of the touch electrodes TE are different may be preset and stored in the register of the timing controller 400 together with position information of a corresponding subpixel.

The touch controller 500 may receive the touch synchronization signal from the timing controller 400, generate a PWM signal and touch control signals which are required for touch sensing, and supply the PWM signal and the touch control signals to the touch data driver 300 and the TP IC 600. The touch controller 500 may receive touch sensing data from the touch data driver 300, generate touch coordinates of a touch node with a touch and supply the touch coordinates to the host system.

In particular, the touch controller 500 may transmit position information of the touch occurrence area to the timing controller 400 and share the position information therewith.

The gate driver 200 may receive the gate control signals from the timing controller 400, generate a gate pulse (scan pulse) according to the gate control signals during the display operation period DP, and sequentially and individually drive the gate lines GL of the corresponding pixel block. During each display operation period DP, the gate driver 200 may supply a gate pulse of a gate-on voltage to a corresponding gate line GL at each driving period of the corresponding gate line GL according to the gate control signal, and during a non-driving period of the corresponding gate line GL, the gate driver 200 may supply a gate-off voltage, which is supplied from the TPIC 600, to the corresponding gate line GL.

During each touch operation period TP, the gate driver 200 may supply a gate-off modulation signal, which is supplied from the TPIC 600, to the gate lines GL.

Meanwhile, in response to the gate control signal adjusted during each display operation period DP under the control of the timing controller 400, the gate driver 200 may adjust the pulse width of the gate signal supplied to the corresponding gate line to compensate the variation of the gate signal for the difference in condition between the touch nodes.

The gate driver 200 may be formed in a TFT substrate together with a TFT array constituting the pixel matrix of the panel 100 to be embedded in a bezel area of the panel 100 as a gate in panel (GIP) type. The GIP type gate driver 200 may be located on one side portion of panel 100 or both side portions thereof. Meanwhile, the gate driver 200 may be formed of a plurality of gate drive integrated circuits (ICs), may be individually mounted on a circuit film such as a chip on film (COF), and may be bonded to the panel 100 using a tape automatic bonding (TAB) method or may be mounted on the panel 100 using a chip on glass (COG) method.

The touch data driver 300 may receive the image data and the data control signals from the timing controller 400, convert the image data into analog data signals during each display operation period DP, and supply the analog data signals to the data lines DL of the panel 100. The touch data driver 300 may convert digital image data into the analog data signals using gradation voltages in which a plurality of reference gamma voltages supplied from a gamma voltage generator (not shown) are segmented. During each display operation period DP, the touch data driver 300 may supply the common voltage VCOM, which is supplied from the TPIC 600, to the touch electrodes TE through the touch routing lines TL to allow the touch electrodes TE to operate as common electrodes.

During each touch operation period TP, the touch data driver 300 may supply the touch synchronization signal supplied from the TPIC 600 to the touch electrodes TE of the corresponding block through the touch routing lines TL of the corresponding block. Meanwhile, the touch data driver 300 may supply the touch synchronization signal to the data lines DL during the touch operation period TP or supply the data modulation signal having the same phase and the same amplitude as the touch synchronization signal.

The touch data driver 300 may include a built-in readout circuit, supply the touch synchronization signal to the touch electrodes TE of the corresponding touch block through the touch routing lines TL during each touch operation period TP, and then read out a signal fed back from each touch electrode TE through an individual touch routing line TL. The touch data driver 300 may differentially amplify the touch synchronization signal and the readout signal with respect to each touch electrode TE to sense a variation in self-capacitance (a signal delay amount) of each touch electrode TE due to a touch, generate touch sensing data through signal processing, and supply the touch sensing data to the touch controller 500.

In particular, under the control of the timing controller 400, the touch data driver 300 may supply the compensated data signal to subpixels in the touch occurrence region or an area in which the touch electrodes have different sizes during each display operation period DP to charge the subpixels so that distortion of the data signal due to the difference in condition between the touch nodes may be corrected.

The touch data driver 300 may be formed of one or more touch data drive ICs, and each IC may be individually mounted on a circuit film such as a COF and bonded to the panel 100 using a TAB method or mounted on the panel 100 using a COG method. The touch data drive IC may be referred to as a source-readout (SR) IC.

Figure 4:
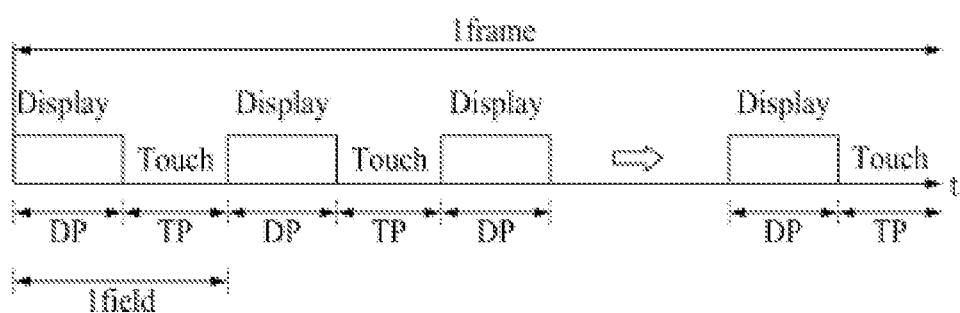
FIG. 4 is a timing diagram illustrating the time division driving method of one frame of the touch display device according to one embodiment.
Figure 5:
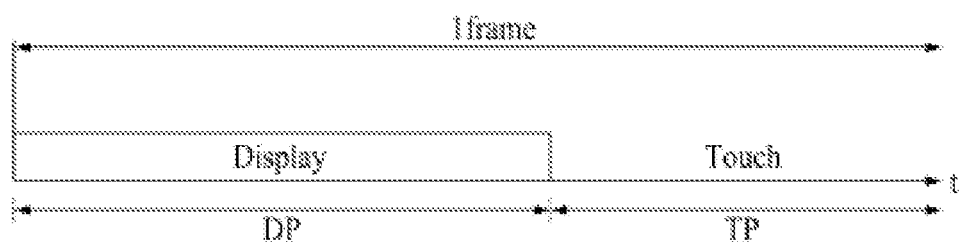
FIG. 5 is a timing diagram illustrating the time division driving method of one frame of the touch display device according to one embodiment.

FIGS. 4 and 5 are timing diagrams illustrating the time division driving method of one frame of the touch display device according to one embodiment.

Referring to FIG. 4, under the control of the touch synchronization signal generated from the timing controller 400, each frame period may include a plurality of display operation periods DP for time-divisionally driving the pixel matrix of the panel 100 as a plurality of pixel blocks, and a plurality of touch operation periods TP for time-divisionally driving the touch electrode matrix of the panel 100 as a plurality of touch blocks, and each display operation period DP and each touch operation period TP may operate alternately. One display operation period DP and one touch operation period TP may be defined as one field period.

Referring to FIG. 5, under the control of the touch synchronization signal generated from the timing controller 400, each frame period may be time-divisionally divided into one display operation period DP in which data is written in each sub-pixel of the pixel matrix of the panel 100, and one touch operation period TP in which the touch electrode matrix of the panel 100 is driven and sensed.

During each touch operation period TP, the touch data driver 300 may supply the touch synchronization signal, which is supplied from the TPIC 600, to corresponding touch routing lines TL and read out a variation in capacitance of each of the electrodes TE of the corresponding touch block through the corresponding touch routing lines TL. The touch data driver 300 may perform signal processing on the readout signal to convert the processed readout signal into touch sensing data indicating whether a touch occurs and may supply the touch sensing data to the touch controller 500.

Meanwhile, in order to reduce a parasitic capacitance formed between the touch electrode TE, the gate line GL, and the data line DL in the panel 100 during each touch operation period TP, the gate driver 200 and the touch data driver 300, that is, the panel drivers 200 and 300, may supply the modulation signal having the same voltage and phase as the touch synchronization signal, which is applied to the touch electrode TE, to the gate lines GL and the data lines DL. In other words, during the touch operation period TP, the panel drivers 200 and 300 may supply the touch synchronization signal or the data modulation signal having the same phase and the same amplitude as the touch synchronization signal to the data lines DL of the panel 100 and supply a gate-off modulation signal having the same phase and the same amplitude as the touch synchronization signal to the gate lines GL. Accordingly, during the touch operation period TP, the touch electrodes TE may be driven load-free to improve touch sensing sensitivity.

During each display operation period DP, under the control of the timing controller 400, the touch data driver 300 may convert the image data, which is supplied in each horizontal period, into an analog data signal to supply the analog data signal to the data lines DL of the panel 100 and supply the common voltage VCOM, which is supplied from the TPIC 600, to the touch electrodes TE through the touch routing lines TL. During each display operation period DP, under the control of the timing controller 400, the gate driver 200 sequentially drives the gate lines GL to allow the data signal, which is supplied to the data lines DL in each horizontal period, to be supplied to and charged in the corresponding subpixel.

Figure 6:
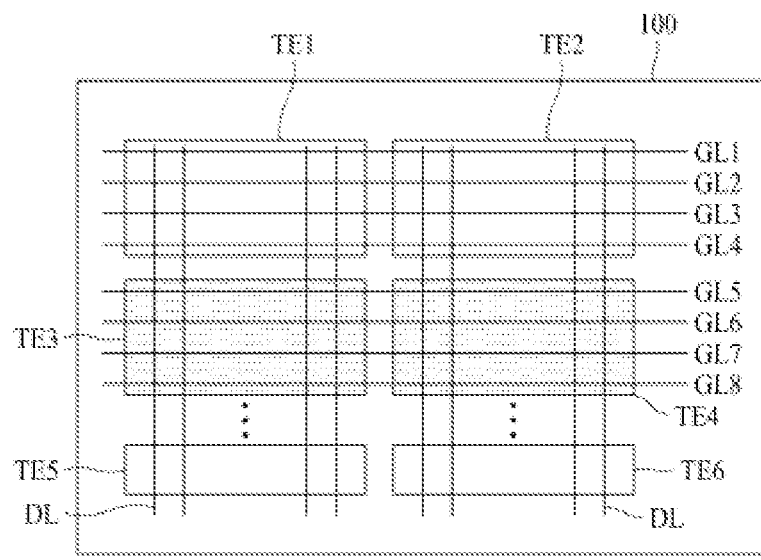
FIG. 6 is a diagram illustrating a method of compensating for a difference in condition between touch nodes in the touch display panel according to one embodiment.
Figure 7:
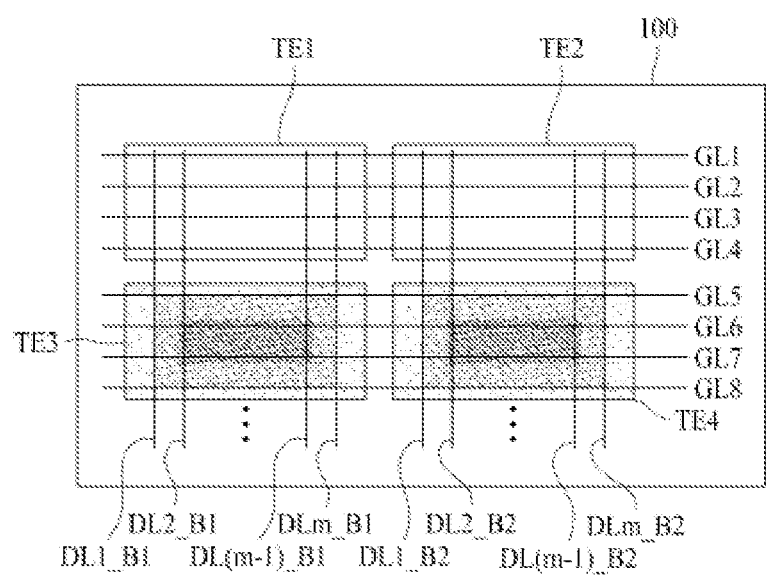
FIG. 7 is a diagram illustrating the method of compensating for the difference in condition between touch nodes in the touch display panel according to one embodiment.

FIGS. 6 and 7 are diagrams illustrating the method of compensating for the difference in condition between touch nodes in the touch display panel according to one embodiment.

Referring to FIGS. 6 and 7, a touch occurs at a third touch node of a third touch electrode TE3 and a fourth touch node of a fourth touch electrode TE4, and the third and fourth nodes of the third and fourth touch electrodes TE3 and TE4, in which the touch occurs, have potential differences with respect to first and second touch nodes of first and second touch electrodes TE1 and TE2, in which the touch does not occur.

In order to prevent distortion of the display signal due to the potential differences between the touch nodes, a data signal compensated through the touch data driver 300 and the corresponding data line DL may be supplied to subpixels of the touch occurrence area in which the third and fourth touch nodes of the third and fourth touch electrodes TE3 and TE4, in which with the touch occurs, are located. In addition, the gate signal having a pulse width, which is compensated through the gate driver 200 and corresponding gate lines GL5, GL6, GL7, and GL8, may be supplied to the subpixels of the touch occurrence area.

Meanwhile, even when the touch does not occur and when sizes of fifth and sixth touch electrodes TE5 and TE6 are different from sizes of the remaining touch electrodes TE1 to TE4, a data signal, which is compensated through the touch data driver 300 and corresponding data lines DL or compensated through the gate driver 200 and corresponding gate lines GL, may be supplied to subpixels in which the fifth and sixth touch electrodes TE5 and TE6 are located. On the other hand, even when the touch electrodes have the same size, and in the case of a compensation area requiring compensation for a different physical structure between the touch nodes in which the touch electrodes are located, the compensated data signal or the compensated gate signal may be supplied to the subpixels of a corresponding compensation area. In addition, in the touch occurrence area in which the third and fourth touch nodes of the third and fourth touch electrodes TE3 and TE4, in which the touch occurs, are located, a data signal to which a different compensation value is applied for each data line DL may be supplied, or a gate signal to which a different compensation value is applied for each gate line GL may be supplied.

Meanwhile, according to the physical structure difference between the touch nodes and the alternating operation of the display operation and the touch operation without being limited to the touch occurrence area where the touch occurs, the compensated data signal or the compensated gate signal may be supplied to subpixels of an entire area of the panel 100.

Referring to FIG. 7, the data signal or the gate signal may be differently compensated for a distance from an adjacent touch node in the third and fourth touch nodes of the third and fourth touch electrodes TE3 and TE4 in which the touch occurs.

For example, in each of the third and fourth touch nodes of the third and fourth touch electrodes TE3 and TE4 in which the touch occurs, a data signal or a gate signal to which a first compensation value is applied may be supplied to the subpixels connected to the corresponding gate lines GL5 and GL8 and the corresponding data lines DL1_B1, DLm_B1, DL1_B2, and DLm_B2 in a first compensation area closest to an adjacent touch node.

Alternatively, in each of the third and fourth touch nodes of the third and fourth touch electrodes TE3 and TE4 in which the touch occurs, a data signal or gate signal to which a second compensation value different from the first compensation value is applied may be supplied to subpixels connected to corresponding gate lines GL6 and GL7 and data lines DL2_B1, DL(m-1)_B1, DL2_B2, and DL(m-1)_B2 in a second compensation area having a distance that is different the distance of the first compensation area from the adjacent touch node.

Figure 8:
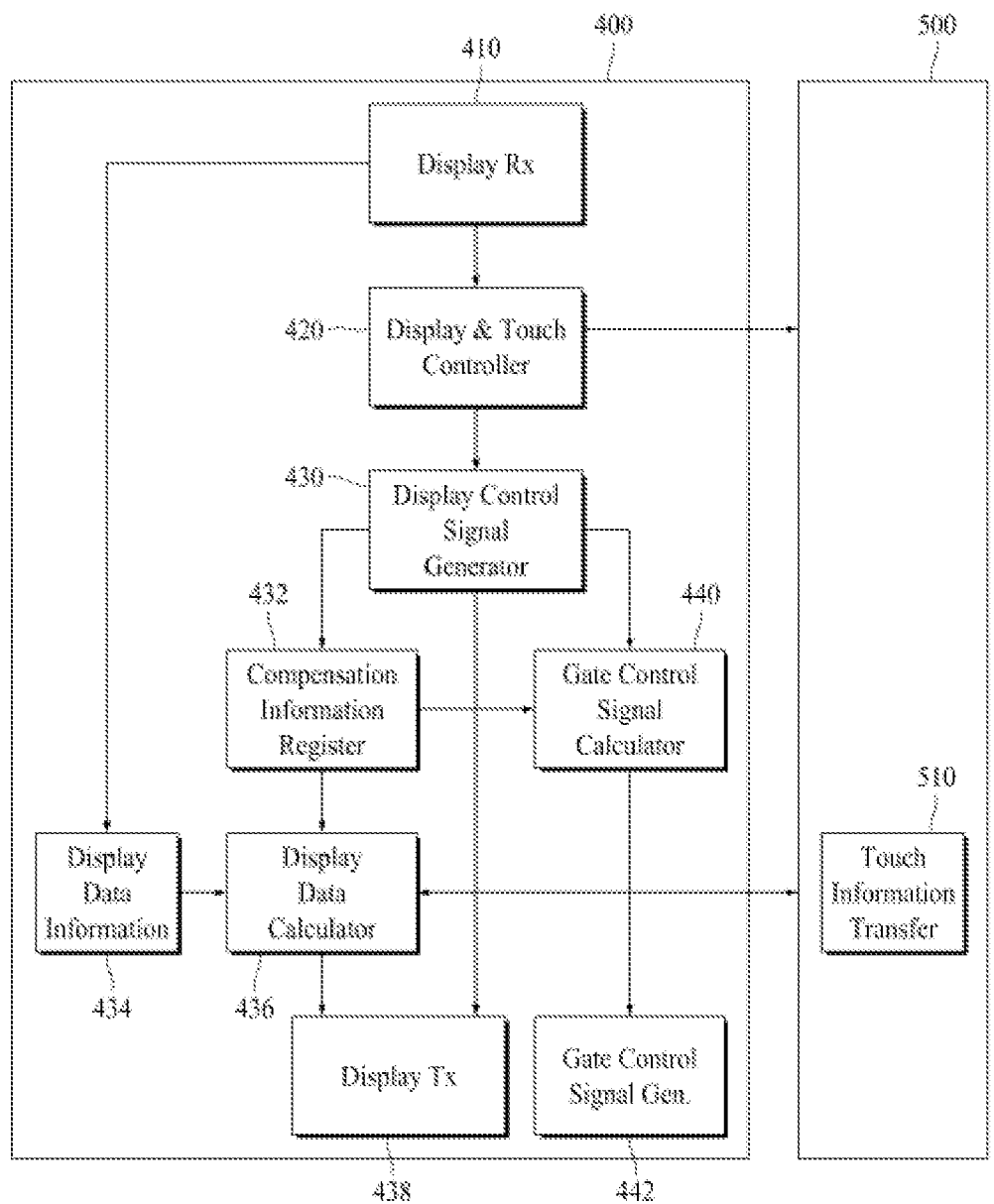
FIG. 8 is a block diagram illustrating a timing controller and a touch controller in the touch display device according to one embodiment.

FIG. 8 is a block diagram illustrating the timing controller 400 and the touch controller 500 in the touch display device according to one embodiment.

Referring to FIG. 8, the timing controller 400 according to one embodiment may receive display data and synchronization signals (including a vertical synchronization signal, a horizontal synchronization signal, a dot clock, and a data enable signal) from the host system through the display receiver 410. The display receiver 410 may store the received display data in a memory 434 for storing display data information. The display receiver 410 may supply the received synchronization signals (including the vertical synchronization signal, the horizontal synchronization signal, the dot clock, and the data enable signal) to a display & touch controller 420.

By using the received synchronization signals, the display & touch controller 420 may generate a touch synchronization signal for determining the display operation period DP and the touch operation period TP and supply the generated touch synchronization signal and other synchronization signals to a display control signal generator 430. The display & touch controller 420 may output the touch synchronization signal to the touch controller 500.

By using the touch synchronization signal and the other synchronization signals, which are provided from the display & touch controller 420, the display control signal generator 430 may generate data control signals for controlling the touch data driver 300 during each display operation period DP. The display control signal generator 430 may output the data control signals to a display transmitter 438. The display control signal generator 430 may output the touch synchronization signal and the other synchronization signals to a gate control signal calculator 440 or the gate control signal generator 443.

During the display operation period DP, under the control of the display control signal generator 430, the compensation information register 432 may output compensation information, which includes the position information of the compensation area and a compensation value to be supplied to the compensation area, to a display data calculator 436. Meanwhile, the compensation information register 432 may output the position information of the compensation area and compensation information including a compensation value of the gate signal to the gate control signal calculator 440. The compensation information stored in the compensation information register 432 is preset and stored therein. The position information of the compensation area and the compensation value may be set to correspond to each of a plurality of compensation areas which are divided according to a distance from an adjacent touch node in each touch node. The position information of the compensation area and the compensation value may be set to correspond to compensation areas of the touch nodes having different sizes.

The display data calculator 436 may receive the position information of the touch node where the touch occurs, that is, position information of the touch occurrence area, through communication with a touch information transfer 510 of the touch controller 500.

By using the position information of the touch occurrence area supplied from the touch controller 500, the display data calculator 436 may determine whether a corresponding subpixel is located in the touch occurrence area or the touch non-occurrence area.

In the case of a subpixel located in the touch occurrence area, the display data calculator 436 may apply the compensation value provided from the compensation information register 432 to the display data provided from the memory 434, generate compensated display data, and output the compensated display data to the display transmitter 438. In this case, the display data calculator 436 may apply the compensation value of each subpixel provided according to the compensation area within each touch node from the compensation information register 432 to corresponding display data, compensate the display data, and output the compensated display data to the display transmitter 438.

The display data calculator 436 may output the display data of the touch non-occurrence area, which is not included in the touch occurrence area, to the display transmitter 438 without compensation.

Meanwhile, in the case of a subpixel included in the touch occurrence area, in which the sizes of the touch electrodes are different, which is provided from the compensation information register 432, the display data calculator 436 may apply the compensation value provided from the compensation information register 432 to the display data provided from the memory 434, generate compensated display data, and output the compensated display data to the display transmitter 438.

The display transmitter 438 (display Tx) may convert the display data supplied from the display data calculator 436 and the data control signals supplied from the display control signal generator 430 into transmission data in a high-speed serial interface manner and transmit the transmission data to the touch data driver 300.

By using the touch synchronization signal and the other synchronization signals provided from the display control signal generator 430, the information on the touch generation area provided from the touch information transfer 510 of the touch controller 500, and the compensation area information and the compensation value provided from the compensation information register 432, the gate control signal calculator 440 may generate a gate compensation signal for adjusting a timing such as the pulse width of the gate signal to be supplied to the gate line GL of the compensation area (a horizontal line). The gate control signal calculator 440 may output the touch synchronization signal, the other synchronization signals, and the generated gate compensation signal to a gate control signal generator 442. The gate control signal calculator 440 may be omitted.

By using the touch synchronization signal, the other synchronization signals, and the gate compensation signal, which are provided from the gate control signal calculator 440, the gate control signal generator 442 may generate gate control signals for controlling the gate driver 200 during each display operation period DP. On the other hand, when the gate control signal calculator 440 is omitted, by using the touch synchronization signal and the other synchronization signals, which are provided from the display control signal generator 430, the gate control signal generator 442 may generate the gate control signals for controlling the gate driver 200 during each display operation period DP. The gate control signal generator 442 may output the gate control signals to the gate driver 200.

FIG. 9 is a flowchart illustrating a method of driving a touch display device according to one embodiment, and the method is performed by the timing controller 400 shown in FIG. 1.

Referring to FIG. 9, the timing controller 400 inputs display data and synchronization signals supplied from the host system (S802). The timing controller 400 stores the display data in the memory 434 which stores display data information. By using the synchronization signals, the timing controller 400 generates a touch synchronization signal for determining the display operation period DP and the touch operation period TP.

The timing controller 400 may determine whether the touch synchronization signal indicates the display operation period DP or the touch operation period TP (S804).

When the timing controller 400 outputs the touch synchronization signal to the touch controller 500 and thus the touch synchronization signal indicates the touch operation period TP (No of S804), the timing controller 400 allows the panel 100 to perform a touch operation through the touch controller 500 (S806).

When occurrence of a touch is detected by sensing a variation in capacitance of the touch electrodes TE during the touch operation period TP, the touch controller 500 may generate position information on the touch occurrence region that is position information on the touch nodes where the touch occurs. The touch controller 500 may transmit touch information including the position information on each touch node where the touch occurs to the timing controller 400 and share the touch information therewith (S805). Meanwhile, the touch controller 500 may transmit the physical structure information and the position information on each touch node to the timing controller 400 and share the physical structure information and the position information therewith.

When the touch synchronization signal indicates the display operation period DP (Yes of S804), the timing controller 400 may determine whether the compensation area corresponds to a compensation area requiring compensation using the position information on the touch occurrence area supplied from the touch controller 500 (position information on each touch node where the touch occurs) and the compensation area information stored in the compensation information register 432 (S808).

When the compensation area is a compensation area included in the touch occurrence area, a compensation area in which the sizes of the touch electrodes are different, or a compensation area in which the physical structures of the touch nodes are different (Yes of S808), the timing controller 400 checks the compensation area for each of the plurality of compensation areas using the compensation region information stored in the compensation information register 432 (S810).

By using the compensation data on each subpixel stored in the compensation information register 432 and the display data stored in the memory 434 for each compensation area, the timing controller 400 may perform a compensation operation on the display data of the compensation area for each subpixel and output the compensated display data (S812).

The timing controller 400 outputs the compensated display data to the touch data driver 300, and thus the compensated display data is supplied to the panel 100 during the display operation period DP so that the panel 100 performs a display operation (S814).

Meanwhile, when it is determined that the compensation area is not a compensation area which requires compensation (No of S808), the timing controller 400 outputs the display data to the touch data driver 300 without compensation, and thus the display data may be supplied to the panel 100 during the display operation period DP (S814).

As described above, in accordance with the touch display device, the method of driving the same, and the timing controller according to one aspect of the present disclosure, the display signal (the data signal and the gate signal) is compensated for the potential difference between the touch node where a touch occurs and the touch node where a touch does not occur after the touch operation so that when the touch occurs, it is possible to reduce the distortion of the display image due to the difference in condition between the touch nodes and improve the display performance.

In accordance with the touch display device, the method of driving the same, and the timing controller according to one aspect of the present disclosure, the display signal (the data signal and the gate signal) is compensated for the difference in size between the touch nodes so that it is possible to reduce the distortion of the display image due to the difference in physical condition between the touch nodes and improve the display performance.

The touch display device and the timing controller according to the embodiment may be applied to various electronic devices. For example, the touch display device and the timing controller according to the embodiment may be applied to a mobile device, a video phone, a smart watch, a watch phone, a wearable device, a foldable device, a rollable device, a bendable device, a flexible device, a curved device, an electronic notebook, an e-book, a portable multimedia player (PMP), a personal digital assistant (PDA), an MPEG audio layer-3 player, a mobile medical device, a desktop personal computer (PC), a laptop PC, a netbook computer, a workstation, a navigation device, a vehicle navigation device, a vehicle display device, a television, a wallpaper display device, a signage device, a game device, a notebook computer, a monitor, a camera, a camcorder, a home appliance, and the like.

Features, structures, effects, etc. described above in various examples of the present disclosure are included in at least one example of the present disclosure and are not necessarily limited to only one example. Furthermore, features, structures, effects, etc. illustrated in at least one example of the present disclosure may be combined or modified for other examples by those skilled in the art to which the technical idea of the present disclosure pertains. Therefore, the contents related to such combinations and modifications should be interpreted as being included in the technical spirit or scope of the present disclosure.

While the present disclosure described above is not limited to the above-described embodiments and the accompanying drawings, it will be apparent to those skilled in the art to which the present disclosure belongs that various substitutions, modifications, and changes may be made herein without departing from the scope of the present disclosure. Therefore, the scope of the present disclosure is defined by the appended claims, and all changes or modifications derived from the meaning, scope, and equivalence of the claims are to be construed as being included in the scope of the present disclosure.

What is claimed is:

1. A touch display device comprising:
    a panel driver configured to drive gate lines and data lines of a panel and drive and sense touch electrodes;
    a timing controller configured to control an operation of the panel driver; and
    a touch controller configured to control touch electrode driving and a sensing operation of the panel driver,
    wherein the timing controller is configured to compensate a display signal for a difference between a condition of a touch node where a touch occurs and a condition of a touch node where a touch does not occur or a difference between physical structures of touch nodes in the panel, wherein the timing controller is configured to compensate at least one of a data signal and a gate signal which is supplied to subpixels of a touch occurrence area in which the touch node where a touch occurs is located or is supplied to subpixels of a touch node which is set as a compensation area according to the difference between the physical structures of the touch nodes, and wherein said at least one of the data signal and the gate signal is compensated by applying a preset compensation value.

2. The touch display device of claim 1, wherein the timing controller is configured to additionally compensate at least one of the data signal and the gate signal, which is supplied to subpixels in which touch electrodes having different sizes are located, by applying a preset compensation value.

3. The touch display device of claim 1, wherein:
subpixels overlapping each touch node are divided into a plurality of compensation areas according to a distance from an adjacent touch node; and
the timing controller is configured to compensate data to be supplied to the subpixels of the touch occurrence area or the subpixels of the touch node which is set as the compensation area by applying different compensation values to the subpixels overlapping each touch node according to the plurality of compensation areas or by applying the same compensation value to the subpixels overlapping each touch node.

4. The touch display device of claim 1, wherein the timing controller is configured to compensate a pulse width of a gate signal to be supplied to the subpixels of the touch occurrence area or the compensation area by applying a different compensation value or the same compensation value to each subpixel.

5. The touch display device of claim 1, wherein the timing controller is configured to:
receive position information of each touch node where a touch occurs from the touch controller and determine whether a subpixel is included in the touch occurrence area or a touch non-occurrence area; or
receive physical structure information and position information of each touch node from the touch controller and determine whether the corresponding subpixel is included in the touch occurrence area or the touch non-occurrence area.

6. The touch display device of claim 1, wherein the timing controller is configured to:
generate a touch synchronization signal for time-divisionally driving each frame period as each display operation period and each touch operation period;
control the panel driver to direct the panel to perform a display operation during each display operation period on the basis of the touch synchronization signal; and
share the touch synchronization signal with the touch controller and control the panel driver to direct the panel to perform a touch operation during each touch operation period.

7. The touch display device of claim 6, wherein the timing controller includes:
a memory configured to store input data;
a compensation information register configured to store position information and a compensation value of the compensation area; and
a display data calculator configured:
for a subpixel included in the touch occurrence area or the compensation area during each display operation period, to apply the compensation value according to the position information of the compensation area provided from the compensation information register to data output from the memory and output compensated data, and
for a subpixel included in a touch non-occurrence area or a non-compensation area, to output data from the memory without compensation.

8. The touch display device of claim 7, wherein, during each display operation period, for a subpixel included in the compensation area stored in the compensation information register due to a difference in size between the touch electrodes, the display data calculator is configured to apply the compensation value from the compensation information register to the data output from the memory and output the compensated data.

9. The touch display device of claim 7, wherein the timing controller includes:
a gate control signal calculator configured to generate, during each display operation period, an adjustment signal for adjusting a pulse width of a corresponding gate signal according to the position information and the compensation value of the compensation area provided from the compensation information register in the case of the for a subpixel included in the touch occurrence area or in the compensation area stored in the compensation information register; and
a gate control signal generator configured to generate and output, using synchronization signals and the adjustment signal, gate control signals for controlling a gate driver included in the panel driver during each display operation period.

10. The touch display device of claim 6, wherein the panel driver includes:
a touch data driver configured to supply the data signal to the data lines during each display operation period, supply a common voltage to the touch electrodes, supply the touch synchronization signal to the data lines and corresponding touch electrodes during each touch operation period, read out variations in capacitance of the corresponding touch electrodes, and output touch sensing data; and
a gate driver configured to supply a gate signal to corresponding gate lines during each display operation period and supply a gate modulation signal having the same phase and the same amplitude as the touch synchronization signal to the gate lines during each touch operation period.

11. A method of driving a touch display device, comprising:
time-dividing each frame period into each display operation period and each touch operation period using a touch synchronization signal;
generating information on a touch occurrence area, which includes position information of each touch node in a panel where a touch occurs during each touch operation period; and
compensating a display signal supplied to subpixels of the touch occurrence area or supplied to subpixels of a touch node which is set as a compensation area according to a difference between physical structures of touch nodes in the panel during each display operation period,
wherein compensating the display signal comprises compensating at least one of a data signal and a gate signal which is supplied to the subpixels of the touch occurrence area or the compensation area by applying a preset compensation value.

12. The method of claim 11, further comprising, during each display operation period, compensating at least one of a data signal and a gate signal, which are supplied to subpixels in which touch electrodes having different sizes are located by applying a preset compensation value.

13. The method of claim 11, wherein:
subpixels overlapping each touch node are divided into a plurality of compensation areas according to a distance from an adjacent touch node; and
compensating the display panel comprises:
compensating data to be supplied to the subpixels of the touch occurrence area or the compensation area by applying different compensation values to the subpixels overlapping each touch node according to the plurality of compensation areas or by applying the same compensation value to the subpixels overlapping each touch node; or
compensating a pulse width of the gate signal to be supplied to the subpixels of the touch occurrence area or subpixels of the compensation area by applying a different compensation value or the same compensation value to each subpixel.

14. A timing controller being configured to:
compensate a display signal for a difference between a condition of a touch node where a touch occurs and a condition of a touch node where a touch does not occur or a difference between physical structures of touch nodes in a panel,
wherein a preset compensation value is applied to compensate at least one of a data signal and a gate signal, which are supplied to subpixels of a touch occurrence area in which the touch node where the touch occurs is located or supplied to subpixels of a touch node which is set as a compensation area according to a difference between the physical structures of the touch nodes in the panel.

15. The timing controller of claim 14, wherein the preset compensation value is applied to additionally compensate at least one of a data signal and a gate signal which are supplied to subpixels in which touch electrodes having different sizes are located.

16. The timing controller of claim 14, wherein:
subpixels overlapping each touch node are divided into a plurality of compensation areas in the panel according to a distance from an adjacent touch node; and
different compensation values or the same compensation value are applied to the subpixels overlapping each touch node to compensate data to be supplied to the subpixels of the touch occurrence area or the subpixels of the compensation area, wherein the different compensation values are applied to the subpixels overlapping each touch node according to the plurality of compensation areas.

17. The timing controller of claim 14, wherein a different compensation value or the same compensation value is applied to each subpixel to compensate a pulse width of the gate signal to be supplied to the subpixels of the compensation area.

* * * * *